United States Patent
Yun et al.

(10) Patent No.: US 6,195,293 B1
(45) Date of Patent: Feb. 27, 2001

(54) METHOD AND CIRCUIT OF ERASING A FLASH MEMORY

(75) Inventors: Jung Hee Yun; Poong Yeub Lee, both of Kyungki-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/404,145

(22) Filed: Sep. 27, 1999

(30) Foreign Application Priority Data

Sep. 28, 1998 (KR) .................................................. 98-40393

(51) Int. Cl.⁷ ...................................................... G11C 16/04
(52) U.S. Cl. ................ 365/185.29; 365/185.19; 365/185.33; 365/185.02
(58) Field of Search ......................... 365/185.29, 185.19, 365/185.33, 185.02

(56) References Cited

U.S. PATENT DOCUMENTS

| | | | |
|---|---|---|---|
| 5,959,893 | * | 3/1999 | Song ....................................... 365/29 |
| 5,978,272 | * | 11/1999 | Fang et al. ....................... 365/185.27 |
| 6,005,809 | * | 12/1999 | Sung et al. ....................... 365/185.29 |

* cited by examiner

Primary Examiner—David Nelms
Assistant Examiner—Connie C. Yoha
(74) Attorney, Agent, or Firm—Pennie & Edmonds LLP

(57) ABSTRACT

A method of erasing a flash memory according to the present invention includes the steps of: performing a first loop erasing operation so that a source electrode is floated, a program gate electrode is applied with a negative voltage and a drain electrode is supplied with an initial erasing voltage; and performing a second loop erasing operation so that the source electrode is floated, the program gate electrode is applied with the negative voltage and the drain electrode is supplied with a normal erasing voltage higher than the initial erasing voltage.

13 Claims, 4 Drawing Sheets

FIG. 1
(PRIOR ART)
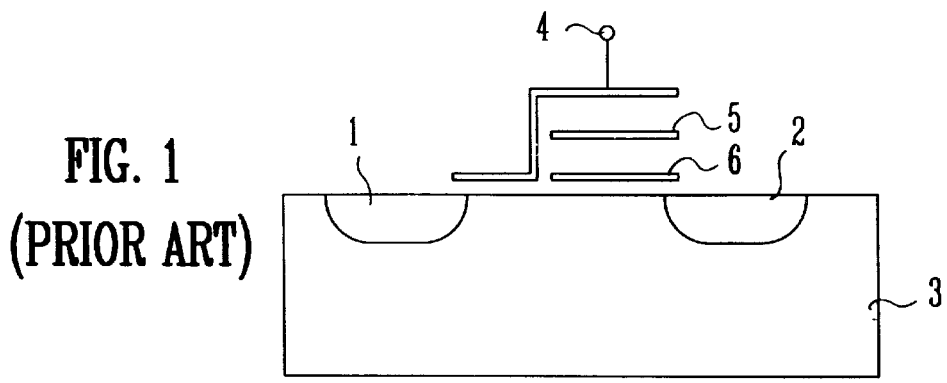
FIG. 2A
(PRIOR ART)
FIG. 2B
(PRIOR ART)
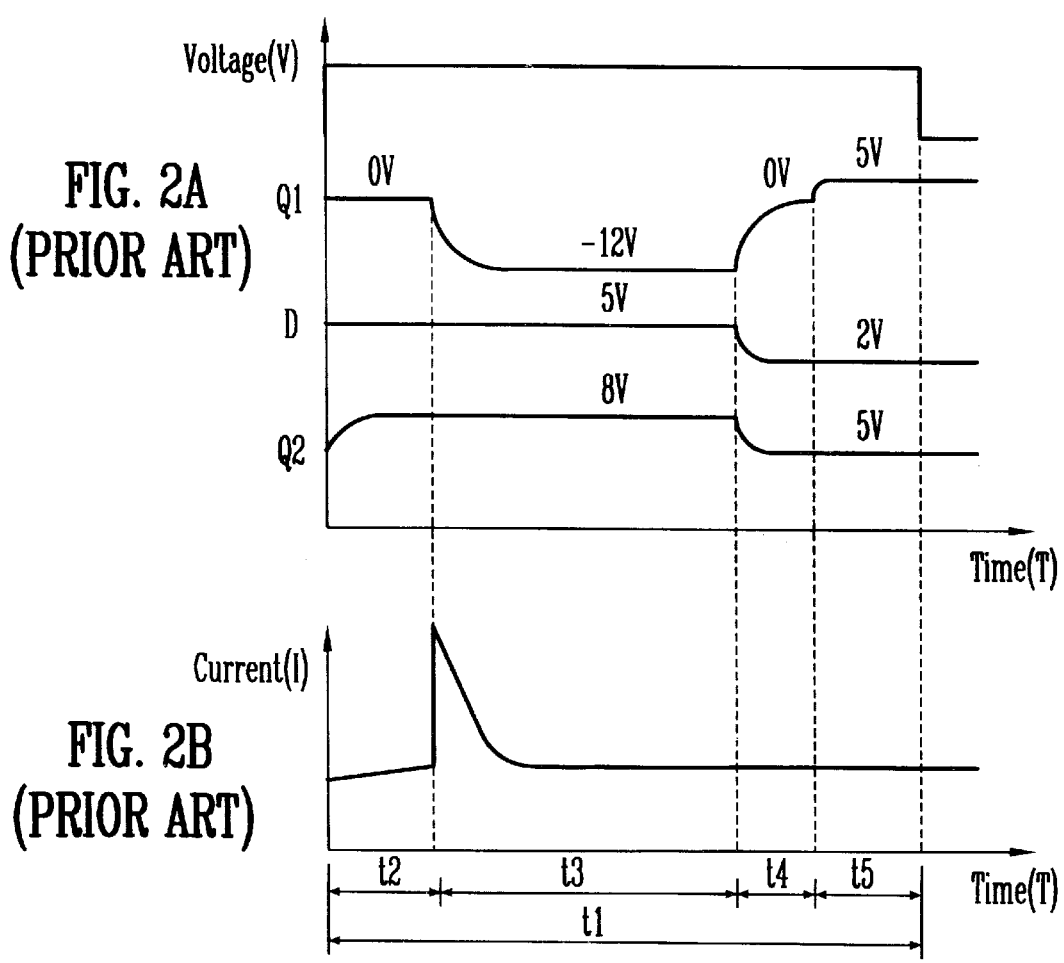

METHOD AND CIRCUIT OF ERASING A FLASH MEMORY

BACKGROUND OF THE INVENTION

1. Field of the Invention

The present invention relates to a method and a circuit of erasing a flash memory cell which can minimize the occurrence of an instantaneous peak current occurring at the beginning of erasing operation of flash memory cell.

2. Description of the Prior Art

FIG. 1 shows a split gate type flash memory cell to illustrate a conventional method of erasing a flash memory cell.

To erase the flash memory cell, 0V is applied to a select gate electrode 4 of the flash memory cell, −12V is applied to a program gate electrode 5, a source electrode 1 is floated, 0V is applied to a P-type substrate 3 and a source voltage Vcc is applied to a drain electrode 2. At this time, electric charges accumulated in a floating gate electrode 6 are discharged to the drain electrode 2 by F-N tunneling so that the flash memory cell performs the erase operation.

FIGS. 2A and 2B are waveform diagrams showing variances of voltages supplied to respective electrodes and of corresponding initial currents at the time of conventional erasing operation. Here, reference numeral E represents an erasing operation voltage, Q1 represents a program bias voltage supplied to the program gate electrode, D represents a drain bias voltage supplied to the drain electrode and Q2 represents a bias voltage for erasing. In FIGS. 2A and 2B, t1 represents an entire erasing operation time, t2 represents an initial erasing operation time, t3 represents an erasing operation time, t4 represents a read operation time, and t5 represents an erasing confirmation operation time, and it can be noted that the instant peak current steeply rises at the initial erasing operation time t2.

In such a conventional erasing circuit, if a plurality of flash memory cells are simultaneously erased, a large current initially flows due to a tunneling phenomenon between the program gate electrode 5 and the drain electrode 2 so that a power of a device, that is, the instant peak current at the source voltage Vcc increased large. And there is a disadvantage that the power of a system using the flash memory device is accordingly influenced, which in turn influences other devices.

SUMMARY OF THE INVENTION

Therefore, the object of the invention is to provide a method and a circuit of erasing a flash memory cell which can removes the disadvantage by supplying, in step, the erasing voltage supplied to the drain electrode to reduce the voltage difference between the program gate electrode and drain electrode at the beginning of erasing operation of the flash memory cell.

To achieve the above object, a method of erasing a flash memory according to the present invention comprising, the steps of:

performing a first loop erasing operation so that a source electrode is floated, a program gate electrode is applied with a negative voltage and a drain electrode is supplied with an initial erasing voltage; and performing a second loop erasing operation so that the source electrode is floated, the program gate electrode is applied with the negative voltage and the drain electrode is supplied with a normal erasing voltage higher than the initial erasing voltage.

A flash memory erasing circuit of the present invention includes:

a source voltage bias circuit for floating the source electrode;

a program gate voltage bias circuit for supplying a negative voltage to the program gate electrode;

a drain erasing voltage control circuit for generating a first and then a second voltage; and a drain voltage bias circuit receiving the first and second voltages for first supplying an initial erasing voltage having a non-zero positive potential and then supplying a normal erasing voltage to the drain electrode.

The drain erasing voltage control circuit of the present invention includes:

an input circuit for receiving a first and a second control signal;

a logic circuit connected between a supply voltage Vcc and ground for generating the first and second voltages in accordance with at least one output of the input circuit and a charge pump; and an output circuit connected between the supply voltage Vcc and an output terminal of the logic circuit, the output circuit being controlled by at least one output of the input circuit and the logic circuit.

The present invention can suppress with maximum the instantaneous peak current occurring at the time of erasing operation of the flash memory cell by weakly erasing at the beginning by using the weak erasing mode at the time of erasing operation of the flash memory cell and thereafter by reducing, in step, the voltage difference between the program gate electrode and drain electrode of the flash memory cell by proceeding the normal erasing mode.

BRIEF DESCRIPTION OF THE DRAWINGS

For fuller understanding of the nature and object of the invention, reference should be had to the following detailed description taken in conjunction with the accompanying drawings in which:

FIG. 1 is a structural drawing of a split gate type flash memory cell to illustrate the conventional method of erasing the flash memory cell;

FIGS. 2A and 2B are waveform diagrams to illustrate the operation of FIG. 1;

Similar reference characters refer to similar parts in the several views of the drawings.

DETAILED DESCRIPTION OF THE INVENTION

The present invention will be described in detail below with reference to the accompanying drawings.

Figure 3:
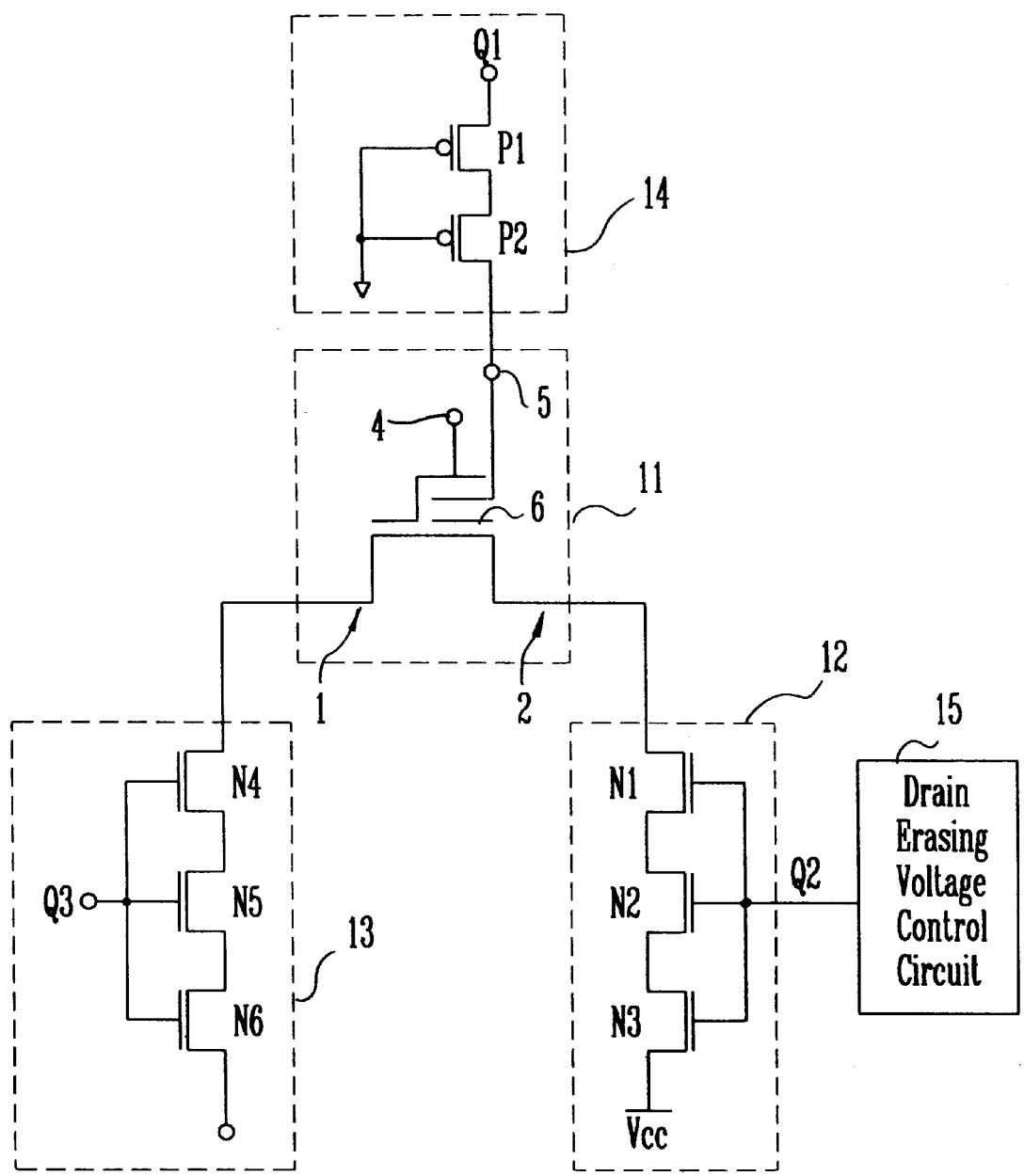
FIG. 3 is a circuit diagram of the erasing circuit of the flash memory cell according to the present invention.

FIG. 3 is a circuit diagram of the erasing circuit of the flash memory cell according to the present invention, and the circuit will be described below in detail with reference to FIGS. 4A and 4B.

The condition of erasing operation of a memory cell block 11 composed of a plurality of split gate type memory cell (only one cell is shown in FIG. 3 for convenience) is that 0V is supplied to an input terminal Q3 of a source voltage bias circuit 13 and a negative high voltage (−12V) which is output from a charge pump (not shown) is supplied to an input terminal Q1 of a program gate voltage bias circuit 14. As seen in FIG. 5, the drain voltage erasing circuit includes an input subcircuit comprising G1, G2 and G3, a logic subcircuit comprising P3, P4, N7, N8 and N9, and an output subcircuit comprising P5 and P6. To an input terminal Q2 of a drain voltage bias circuit 12 are supplied, in step an initial state weak drain erasing voltage (about 5V) and a normal drain erasing voltage (about 8V) which are output from a drain erasing voltage control circuit 15. At this time, NMOS transistors N4 to N6 of the source voltage bias circuit 13 are turned off so that a source electrode 1 comes into a floating state. PMOS transistors P1 and P2 of the program gate voltage bias circuit 14 are turned on so that the negative high voltage (−12V) is supplied to the program gate electrode 5. In addition, NMOS transistors N1 to N3 of the drain voltage bias circuit 12 are turned on by the initial state weak drain erasing voltage (about 5V) so that Vcc−2Vt voltage is supplied to a drain electrode 2. As shown in a weak erasing mode zone A of FIG. 4A, when the erasing voltage output from the drain erasing voltage control circuit 15 is Vcc−Vt, the voltage to a drain electrode D becomes Vcc−2Vt voltage. Therefore, the voltage difference between the program gate electrode 5 and the drain electrode 2 is reduced so that, as shown in a weak erasing mode time t11 of FIG. 4B, the instantaneous peak current induced in the substrate at the beginning is reduced.

Figure 4A:
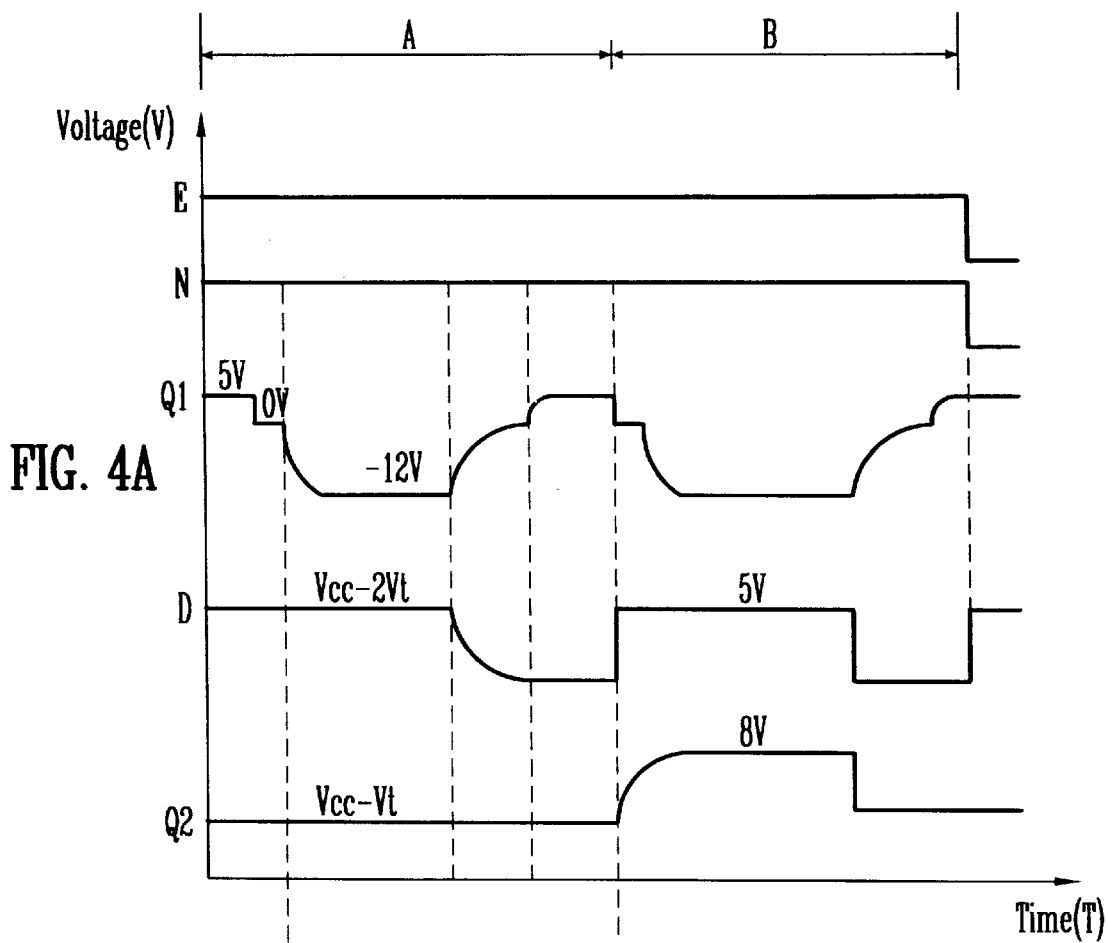
FIGS. 4A and 4B are waveform diagram to illustrate the method of erasing the flash memory cell according to the present invention.
Figure 4B:
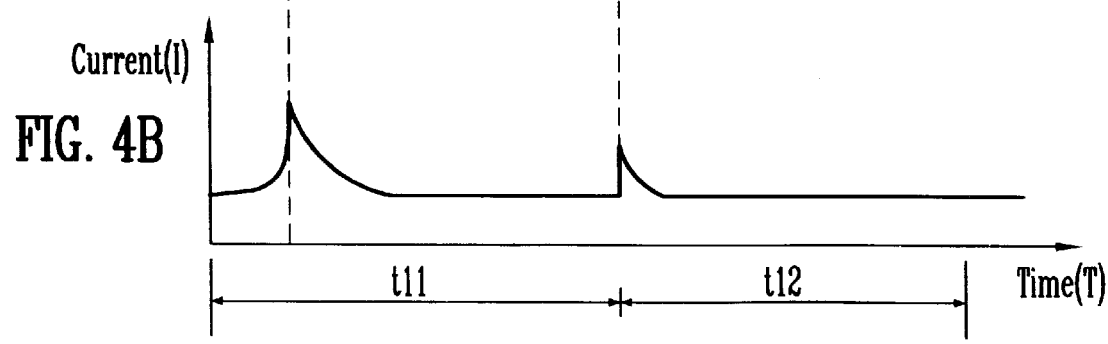
Figure 5:
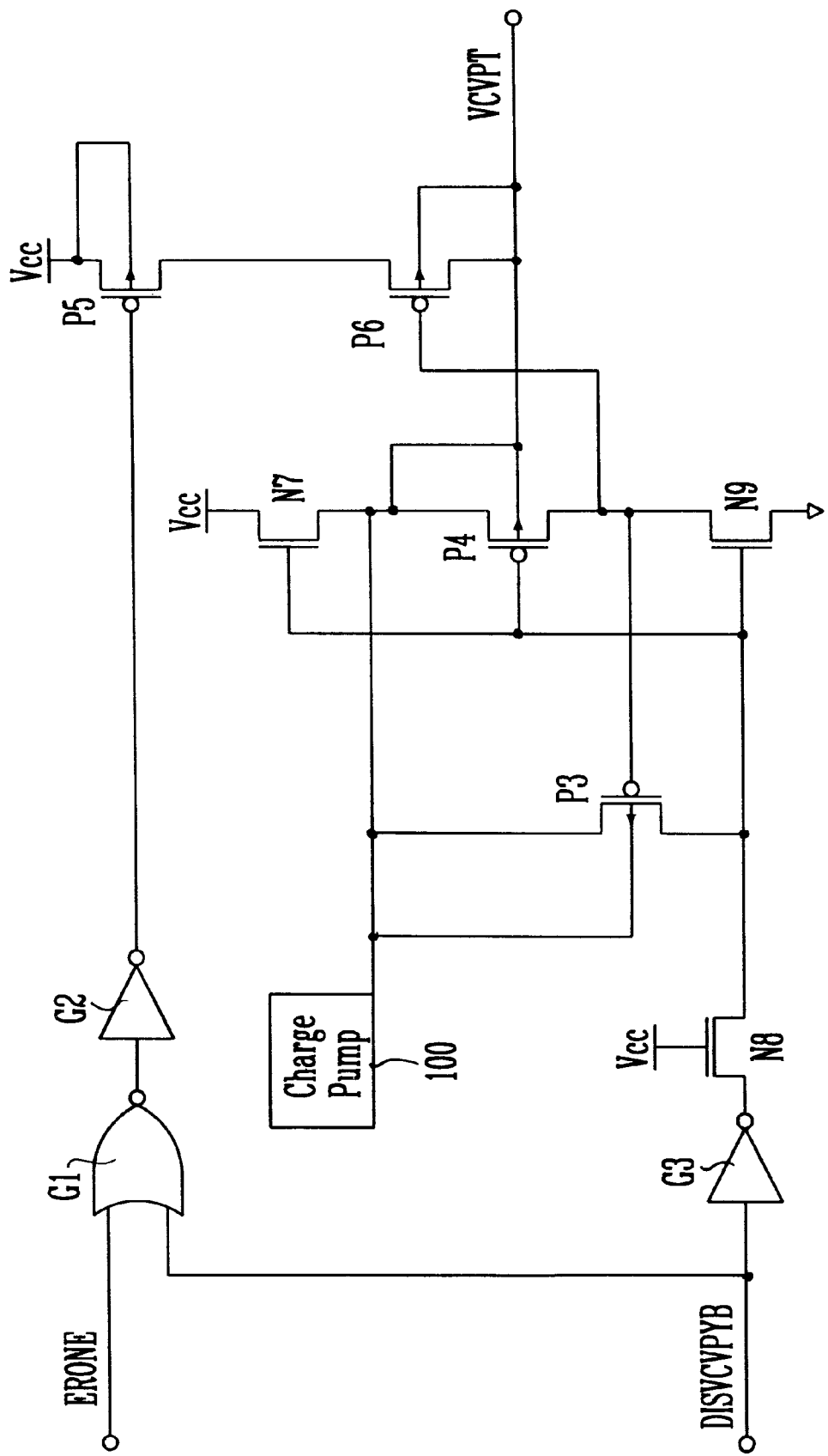
FIG. 5 illustrates a detailed circuit of a drain voltage erasing circuit shown in FIG. 3.

In a normal erasing mode zone B of FIG. 4A, since the erasing voltage output from the drain erasing voltage control circuit 15 normally becomes 8V, a Vcc voltage (5V) is supplied to the drain electrode 2 so that the normal erasing operation is performed. If weakly erased in the weak erasing mode zone A, negative (−) charge of the floating gate electrode 6 is reduced so that, in the normal erasing mode zone B, the voltage difference between the program gate electrode 5 and drain electrode 2 is relatively reduced so that, as shown in the normal erasing mode time t12 of FIG. 4B, the instantaneous peak current is also reduced in the normal erasing mode.

FIG. 5 illustrates a detailed circuit of a drain voltage erasing circuit shown in FIG. 3.

During a first loop erasing operation, when a first control signal ERONE is a high level and a second control signal DISVCVPYB is a low level under the output of a charge pump 100 is a low level, an output of a NOR gate G1 becomes a low level. A PMOS transistor P5 is turned off since an output of an inverter G2 is a high level. An output of an inverter G3 is a high level and inputted to gate electrodes of a NMOS transistors N9 and N7, a PMOS transistor P4 via a NMOS transistor N8. Hence, a PMOS transistor P4 is turned off, while the NMOS transistors N9 and N7 and PMOS transistors P3 and P6 are turned on, whereby an output VCVPT of the drain voltage erasing circuit becomes the voltage of Vcc−Vth. Accordingly, the voltage of Vcc−2Vth is applied to a drain electrode 2 of the flash memory cell During a second loop erasing operation, when the first control signal ERONE is a low level and the second control signal DISVCVPYB is a high level under an output of a charge pump 100 is, for example 8V, an output of a NOR gate G1 becomes a low level. A PMOS transistor P5 is turned off since an output of an inverter G2 is a high level. An output of an inverter G3 is a low level and inputted to gate electrodes of a NMOS transistors N9 and N7, a PMOS transistor P4 via a NMOS transistor N8. Hence, a PMOS transistor P4 is turned on, while the NMOS transistors N9 and N7 and PMOS transistors P3 and P6 are turned off so that an output VCVPT of the drain voltage erasing circuit becomes 8 V.

That is, in the present invention, the erasing is performed by supplying the negative high voltage (−12V) to the program gate electrode 5 of the flash memory cell, supplying a ground voltage 0V to the select gate electrode 4, floating the source electrode 1 and supplying firstly the weak erasing operation voltage to the drain electrode 2 via the drain voltage bias circuit 12, and thereafter, a final erasing operation is performed by secondly supplying the normal erasing operation voltage to the drain voltage bias circuit 12.

As described above, the present invention has an excellent effect that it can suppress the instantaneous peak current occurring at the beginning of erasing operation of memory cell by supplying, in step, the initial state drain erasing voltage (about 5V) and the normal drain erasing voltage (about 8V) to the drain electrode to reduce the voltage difference between the program gate electrode and the drain electrode at the time of erasing operation of the flash memory cell.

What is claimed is:

1. A method of erasing a flash memory comprising the steps of:

performing a first loop erasing operation so that a source electrode is floated, a program gate electrode is applied with a negative voltage and a drain electrode is supplied with an initial erasing voltage having a non-zero positive potential; and then performing a second loop erasing operation so that said source electrode is floated, said program gate electrode is applied with the negative voltage and said drain electrode is supplied with a normal erasing voltage higher than said initial erasing voltage.

2. The method of claim 1, wherein said initial erasing voltage is about Vcc−2Vth and said normal erasing voltage is Vcc, in which Vcc is a supply voltage and Vth is a threshold voltage of a MOS transistor.

3. A circuit for erasing a flash memory having a select gate electrode, program gate electrode, floating gate electrode, source electrode and drain electrode, the circuit comprising:

a source voltage bias circuit for floating said source electrode;

a program gate voltage bias circuit for supplying a negative voltage to said program gate electrode;

a drain erasing voltage control circuit configured to generate a first voltage and then a second voltage in response to at least one control signal; and a drain voltage bias circuit connected to said drain erasing voltage control circuit and configured to receive said first and second voltages, the drain voltage bias circuit further configured to output an initial erasing voltage and then a normal erasing voltage to said drain electrode.

4. The circuit of claim 3, wherein said drain erasing voltage control circuit comprises:

an input circuit configured to receive a first and a second control signal;

a logic circuit connected between a supply voltage Vcc and ground, the logic circuit configured to generate said first and said second voltages in accordance with at least one output of the input circuit and a charge pump; and an output circuit connected between the supply voltage Vcc and an output terminal of the logic circuit, the output circuit being operated by outputs of the input circuit and the logic circuit.

5. The circuit of claim 3, wherein said first voltage is Vcc−Vth, and said second voltage is an output of said charge pump, wherein Vcc is a supply voltage and Vth is a threshold voltage of a MOS transistor.

6. The circuit of claim 3, wherein said initial erasing voltage is about Vcc−2Vth and said normal erasing voltage is Vcc, wherein Vcc is a supply voltage and Vth is a threshold voltage of a MOS transistor.

7. The circuit of claim 3, wherein the initial erasing voltage has a non-zero positive potential and the normal erasing voltage has a positive potential greater in magnitude than a corresponding magnitude of the initial erasing voltage.

8. A method of erasing a flash memory comprising:
a first step of floating a source electrode, applying a negative voltage to a program gate electrode, and supplying an initial erasing voltage having a non-zero positive potential to a drain electrode; followed by
a second step of floating the source electrode, applying a negative voltage to the program gate electrode, and supplying a normal erasing voltage having a non-zero positive potential greater in magnitude than a corresponding magnitude of the initial erasing voltage.

9. The method of claim 8, wherein said initial erasing voltage is about Vcc−2Vth and said normal erasing voltage is Vcc, wherein Vcc is a supply voltage and Vth is a threshold voltage of a MOS transistor.

10. A semiconductor flash memory device comprising at least one flash memory cell having associated therewith a select gate electrode, a program gate electrode, a floating gate electrode, a source electrode and a drain electrode,
the flash memory cell having an associated flash memory erasing circuit comprising:

a source voltage bias circuit for floating the source electrode;
a program gate voltage bias circuit for supplying a negative voltage to the program gate electrode;
a drain erasing voltage control circuit configured to generate a first voltage and then a second voltage in response to at least one control signal; and
a drain voltage bias circuit connected to said drain erasing voltage control circuit and configured to receive said first and second voltages, the drain voltage bias circuit further configured to output an initial erasing voltage and then a normal erasing voltage to said drain electrode, the initial erasing voltage being a non-zero positive potential and the normal erasing voltage being greater than the initial erasing voltage.

11. The semiconductor flash memory device of claim 10, wherein the drain erasing voltage control circuit comprises:
an input circuit configured to receive a first and a second control signal;
a logic circuit connected between a supply voltage Vcc and ground, the logic circuit configured to generate said first and said second voltages in accordance with at least one output of the input circuit and a charge pump; and
an output circuit connected between the supply voltage Vcc and an output terminal of the logic circuit, the output circuit being operated by outputs of the input circuit and the logic circuit.

12. The semiconductor flash memory device of claim 10, wherein the first voltage is Vcc−Vth, and the second voltage is an output of said charge pump, wherein Vcc is a supply voltage and Vth is a threshold voltage of a MOS transistor.

13. The semiconductor flash memory device of claim 10, wherein the initial erasing voltage is about Vcc−2Vth and the normal erasing voltage is Vcc, wherein Vcc is a supply voltage and Vth is a threshold voltage of a MOS transistor.

* * * * *